United States Patent [19]

Nishimura

[11] 4,060,740
[45] Nov. 29, 1977

[54] SENSING AMPLIFIER FOR CAPACITIVE MISFET MEMORY

[75] Inventor: Kotaro Nishimura, Fuchu, Japan

[73] Assignee: Hitachi, Ltd., Japan

[21] Appl. No.: 685,925

[22] Filed: May 12, 1976

[30] Foreign Application Priority Data

May 28, 1975 Japan .................................. 50-62900

[51] Int. Cl.² ...................... H03K 5/18; H03K 3/286; H03K 3/353; G11C 11/40
[52] U.S. Cl. .................................... 307/362; 307/238; 307/279; 307/DIG. 1; 307/DIG. 3; 365/203
[58] Field of Search ............... 307/235 R, 235 T, 238, 307/246, 251, 264, 279, 291, DIG. 1, DIG. 3; 340/173 R, 173 CA

[56] References Cited

U.S. PATENT DOCUMENTS

| 3,612,908 | 10/1971 | Heimbigner | 307/279 |
| 3,868,656 | 2/1975 | Stein et al. | 307/DIG. 3 X |
| 3,876,991 | 4/1975 | Nelson et al. | 340/173 CA X |
| 3,949,381 | 4/1976 | Dennard et al. | 307/DIG. 3 X |
| 3,916,430 | 10/1975 | Heuner et al. | 307/DIG. 1 X |

OTHER PUBLICATIONS

Furman, et al., "Sense Latch Circuit for Memory Cells;" IBM Tech. Discl. Bull.; vol. 16, No. 9, pp. 2792-2793, 2/1974.
Surgent, "Insulated Gate Field-Effect Transistor Sense Amplifier Latch;" IBM Tech. Discl. Bull.; vol. 13, No. 9, pp. 2670-2671, 2/1971.
Rajan, "Single-Control Latch;" IBM Tech. Discl. Bull.; vol. 14, No. 12, p. 3746; 5/1972.

Primary Examiner—John S. Heyman
Assistant Examiner—Larry N. Anagnos
Attorney, Agent, or Firm—Craig & Antonelli

[57] ABSTRACT

In a sensing amplifier for a capacitive MISFET memory, the level of an output signal from the memory is shifted by a signal level shifting circuit and the level-shifted signal is applied to an input of the sensing amplifier to thereby provide a high speed operation.

14 Claims, 6 Drawing Figures

SENSING AMPLIFIER FOR CAPACITIVE MISFET MEMORY

BACKGROUND OF THE INVENTION

1. FIELD OF THE INVENTION

The present invention relates to a sensing amplifier for a capacitive MISFET memory using insulated gate or metal-insulator-semiconductor field effect transistors (hereinafter referred to a MISFETS or simply as FETS).

2. DESCRIPTION OF THE PRIOR ART

In a capactive MISFET memory, amplifying means (sensing amplifier) provided on the side of output line of a memory cell is used to amplify an information signal as an output.

A conventional sensing amplifier includes first and second sensing MISFETs having their gates connected to each other's drain and having their sources grounded, a drive MISFET connected between a supply voltage and the drain of the first sensing MISFET (output terminal), and a precharge MISFET connected between the supply voltage and the drain of the second sensing MISFET (input terminal). One memory cell in the capacitive MISFET memory includes a first reading MISFET which has its drain connected to the input terminal of the sensing amplifier and a second reading MISFET which has its drain connected to the source of the first reading MISFET and its source grounded. The gate of the second reading MISFET is connected to a memory capacitance so that information (output signal) stored on the memory capacitance is supplied to the input terminal of the sensing amplifier when the first reading MISFET receives a reading signal at its gate. The sensing amplifier further includes a precharge capacitor connected to the input terminal of the sensing amplifier at one end thereof and grounded at the other end thereof for presetting the sensing amplifier prior to the application of the output signal from the memory cell to the sensing amplifier. The precharge capacitor is precharged prior to the application of the output signal from the memory cell to the sensing amplifier by applying a first clock signal to the gate of the precharge MISFET in the sensing amplifier. A second clock signal is thereafter applied to the drive MISFET in the sensing amplifier so that the sensing amplifier is brought into a state where it can receive the output signal from the memory cell.

At this stage, the application of the reading signal to the gate of the first reading MISFET in the memory cell causes the second reading MISFET to be turned on when the memory capacitance is charged, i.e., when information "1" is stored therein. As a result, the precharge capacitor begins to discharge through the first and second reading MISFETS in the memory cell. For this reason, the output signal from the memory cell falls low. When the output signal from the memory cell has the voltage less than the threshold voltage of the first sensing MISFET in the sensing amplifier, the first sensing MISFET is turned off and the second sensing MISFET is thus turned on. Thus, the reading of the stored information "1" in the memory cell is accomplished at the output of the sensing amplifier.

A certain time must elapse until the output signal from the memory cell falls near to the threshold voltage of the first sensing MISFET in the sensing amplifier due to the discharge of the precharge capacitor through the first and second reading MISFETs in the memory cell. In view of the fact that the precharge voltage of the precharge capacitor is, for example, 10 to 12 volts and the threshold voltage of the first sensing MISFET is 1 to 2 volts, a long time is required to discharge the precharge voltage by an amount as large as 10 volts through the first and second reading MISFETs in the memory cell including relatively small MISFETs. As a result, there is no possibility of high speed operation.

SUMMARY OF THE INVENTION

An object of the present invention is to provide a sensing amplifier for capacitive MISFET memory with a high speed operation.

In the present invention, the level of an output signal from a memory is shifted by a signal level shifting circuit and the level-shifted signal is applied to an input of a sensing amplifier. The level-shifted output signal produced from the signal level shifting circuit has its level so shifted as to fall to a threshold voltage of a sensing MISFET in the sensing amplifier more rapidly than the output signal from the memory to thereby provide a high speed operation in the sensing amplifier.

BRIEF DESCRIPTIONOF THE DRAWINGS

DESCRIPTION OF THE PREFERRED EMBODIMENTS

An example of a conventional sensing amplifier for capacitive MISFET memory will now be described with reference to FIGS. 1 and 2, prior to description of a sensing amplifier for a capacitive MISFET memory according to the present invention.

Figure 1:
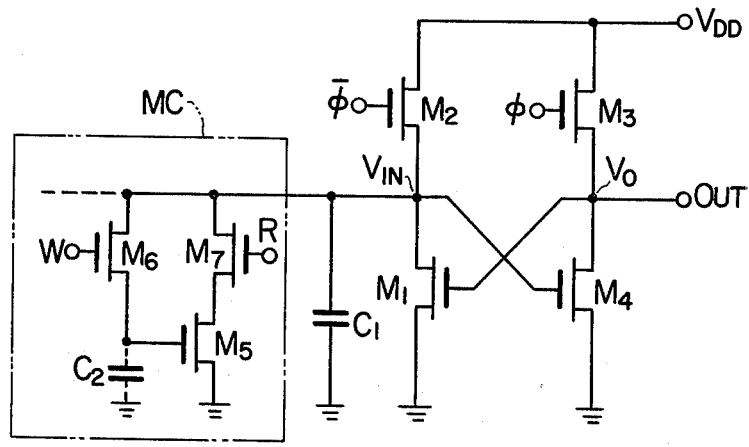
FIG. 1 is a circuit diagram showing one example of a conventional sensing amplifier for a capacitive MISFET memory.

Referring to FIG. 1, a sensing amplifier includes a latch circuit comprising inverters $M_1$, $M_2$ and $M_3$, $M_4$. A first clock signal $\phi$ is applied to the gate of the precharge FET $M_2$ and a second clock signal $\phi$ is applied to the gate of the drive FET $M_3$. On the other hand, the input of the inverter (sensing FET $M_4$) receives an output line signal $V_{IN}$. The clock signals $\phi$, $\phi$ define the precharge operation of the output line and an initial value of the latch circuit at the time of non-selection. A portion MC surrounded with a dotted line in the figure shows a memory cell including FETs $M_5$ to $M_7$ and a memory capacitance $C_2$. A capacitance $C_1$ is an output line capacitance (precharge capacitor).

Figure 2:
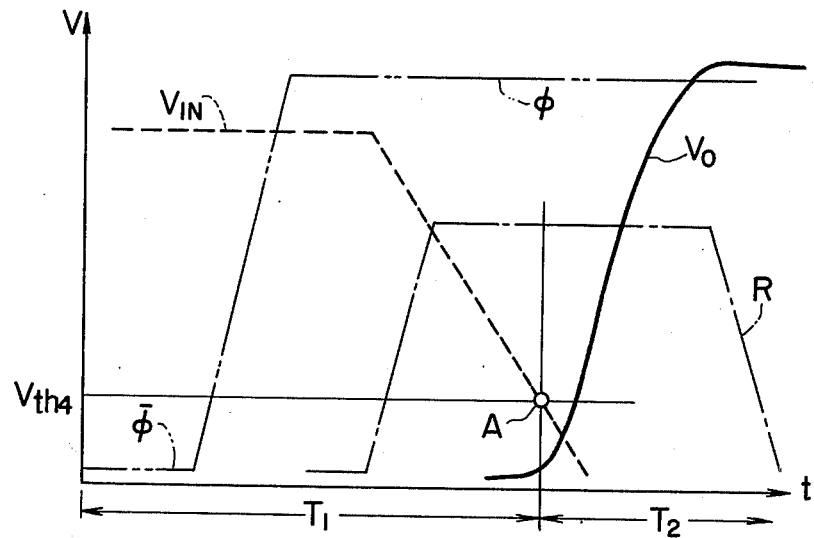
FIG. 2 shows voltage waveforms for explaining the operation of the sensing amplifier in FIG. 1.

Such a circuit provides the following operations during a time interval $T_1$ as shown in FIG. 2. At the time of non-selection of a chip, the clock signal $\phi$ first causes the FET $M_2$ to be turned on to precharge the output line capacitance $C_1$ and define the initialvalue of the latch circuit. At the time of selection of the chip, on the other hand, the clock signal $\phi$ causes the FET $M_3$ to be turned on to read (or write) information from (or in) the memory cell.

At this stage, the presence of a reading signal R at the reading FET $M_7$ in the memory cell causes the capacitance on the output line to begin to discharge because the FET $M_5$ is ON when the memory capacitance $C_2$ in the memory cell is charged (that is, when information "1" is stored). For this reason, the output line signal $V_{IN}$ is brought down as shown in FIG. 2.

When the output line capacitance $C_1$ discharges through the memory cell and the output line signal $V_{IN}$ falls below a threshold voltage $Vth_4$ (a point A in FIG. 2) of the sensing FET $M_4$, the FET $M_4$ is turned off with the result of the rise of its output $V_O$. The other sensing FET $M_1$ is therefore turned on to enable the reading in the stored information "1".

As will be apparent from the above description of the operation, a time interval after which the output line capacitance $C_1$ discharges to a level below the threshold voltage $V_{th4}$ is needed to allow the reading output to be produced. Considering that the supply voltage $V_{DD}$ is, for example, typically 10 to 12 volts and the threshold voltage $V_{th}$ of the MISFET is 1 to 2 volts, it is understood that a long time is required to discharge the voltage by an amount as large as 10 volts through the MISFETs $M_5$, $M_7$ in the memory cell including the relatively small MISFETs.

Figure 3:
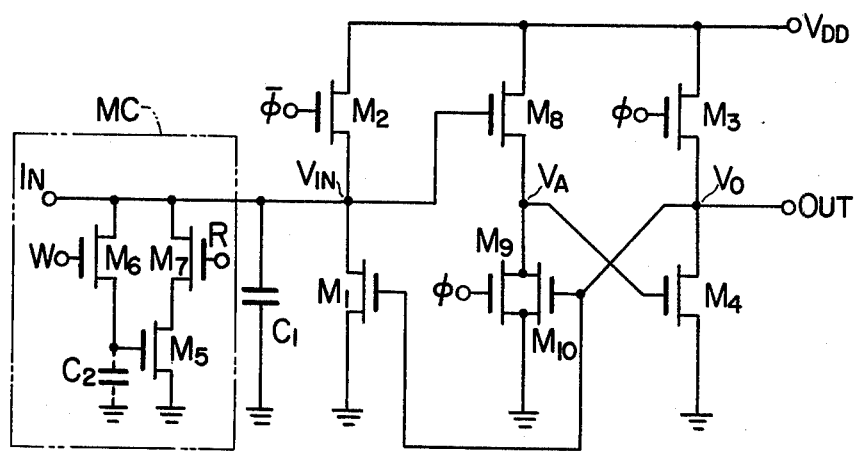
FIG. 3 is a circuit diagram showing an embodiment of a sensing amplifier for a capacitive MISFET memory according to the present invention.

FIG. 3 shows a circuit diagram of a sensing amplifier for capacitive MISFET memory according to the present invention.

In FIG. 3, a portion MC surrounded with a dotted line shows a memory cell including FETs $M_5$ to $M_7$ and a memory capacitance $C_2$. The FET $M_6$ receives a writing signal W and the FET $M_7$ a reading signal R. These FETs operate similarly as those shown in FIG. 1. An inverter including FETs $M_1$, $M_2$ and an inverter including FETs $M_3$, $M_4$ are provided on the side of the output line of the memory cell to provide a latch circuit. The present invention is intended to provide a level shifting circuit for shifting the level of the output line signal $V_{IN}$ at a stage between both the inverters. In other words, a drive FETs $M_8$ is connected in series with a parallel-connected circuit including two load FETs $M_9$, $M_{10}$. These FETs are so arranged that the drive FET $M_8$ receives the output line signal $V_{IN}$ and one ($M_9$) of the two load FETs receives the same clock signal $\phi$ as the FET $M_3$ while the other load FET $M_{10}$ the output $V_O$ from the sensing amplifier. Further, an output $V_A$ from the signal level shifting circuit is applied to the sensing FET $M_4$ serving as an input of the sensing amplifier.

Figure 4:
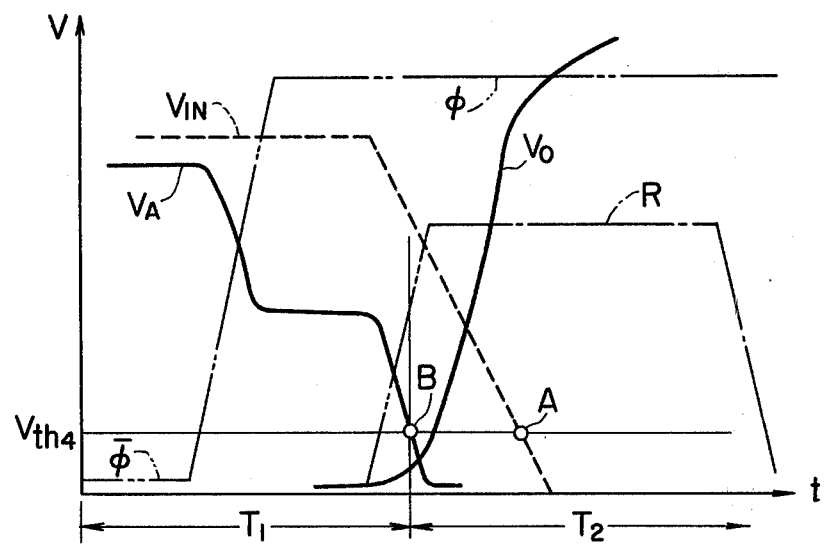
FIG. 4 shows voltage waveforms for explaining the operation of the sensing amplifier in FIG. 3.

The operation of the sensing amplifier with such an arrangement according to the present invention will be described in connection with FIG. 4.

At the time of non-selection of the chip, the clock signal $\phi$ first precharges the output line capacitance $C_1$ and determines the initial value of the latch circuit, and then the clock signal $\phi$ at the time of chip selection brings the memory cell into reading (or writing). This is similar to the operation in the circuit of FIG. 1. In the present invention, however, attention must be paid to the output signal $V_A$ from the signal level shifting circuit. The output $V_A$ from the signal level shifting circuit falls to a voltage level determined by the ratio of the FET $M_8$ to $M_9$ as shown in FIG. 4 because the load FET $M_9$ in the signal level shifting circuit is turned on in the presence of the clock signal $\phi$. In FIG. 4, the ratio of the FET $M_8$ to $M_9$ is so selected that the output voltage $V_A$ is about half as great as the signal voltage $V_{IN}$ on the output line.

At this stage, the presence of the reading signal R in the reading FET $M_7$ of the memory cell causes capacitance $C_1$ to begin to discharge through the FETS $M_5$ and $M_7$ when the FET $M_5$ in ON (that is, when information "1" is stored). The output line signal $V_{IN}$, therefore, falls as shown in FIG. 4 and the output $V_A$ of the signal level shifting circuit also falls.

When the output $V_A$ of the signal level shifting circuit is brought down to a level (a point B in FIG. 2) below the threshold voltage $V_{th4}$ of the sensing FET $M_4$ due to the discharge of the output line capacitance $C_1$, the FET $M_4$ is turned off to cause its output $V_O$ to rise. For this reason, the other sensing FET $M_1$ is turned on to provide the reading in the stored information "1". It should be noted that at this time the FET $M_{10}$ in the signal level shifting circuit is also turned on and this serves to hold the level of the output $V_O$ high.

As described above, in the present invention, the gate of the input FET $M_4$ having an influence upon the speed of the reading operation receives the voltage $V_A$ whose level is shifted half as great as that of the conventional voltage $V_{IN}$ (about 10 to 12 volts), so that the FET $M_4$ is rapidly turned off with the result that the sensing amplifier of high speed operation is provided.

It will be understood that the present invention is not limited to the above emplodiment but realized by using various modifications.

Figure 5:
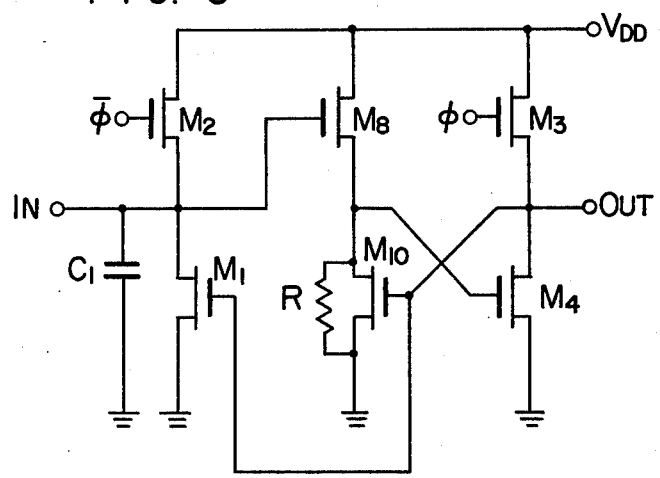
FIGS. 5 and 6 are circuit diagrams showing other embodiments of a sensing amplifier for a capacitive MISFET memory according to the present invention.
Figure 6:
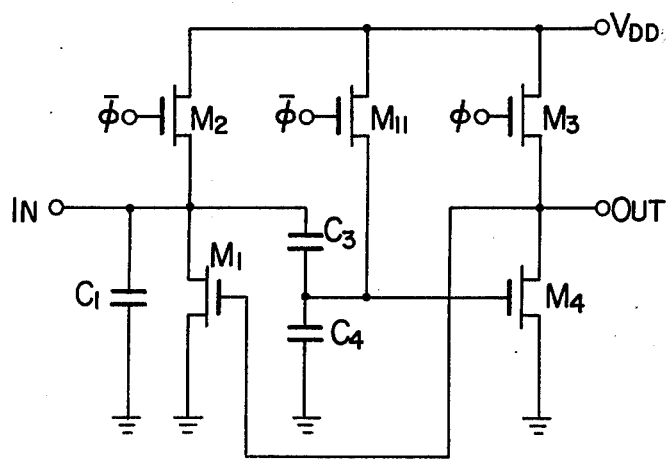

In the above-mentioned embodiment, the level is shifted by setting the ratio of the drive FET $M_8$ to the load FET $M_9$. The present invention is not limited to this, but can be achieved without the load FET $M_9$. As shown in FIG. 5, a resistor R may be connected instead of using the load FET $M_9$. As shwon in FIG. 6, the level shift can further be performed by using a series connection of capacitors $C_3$, $C_4$. In this embodiment, an FET $M_{11}$ is needed to precharge the capacitor $C_4$.

It is to be noted that the output signal from the memory cell must be separated in a DC sense from the input signal $V_A$ to the sensing amplifier, although level shifting menas may be of any type as described above. This is because the capacitance $C_1$ provided on the output line of the memory cell dangerously makes an unexpected discharge if they are made conductive in a DC sense.

It is further needless to say that the ratio of the drive FET $M_8$ to the load FET $M_9$ in the signal level shifting circuit in FIG. 3 may be suitably set depending upon its application.

Further, each load FET may be either of an enhancement type or of a depletion type, but the drive FET is preferably of an enhancement type. The channel of the FET may be an $n$ or $p$ channel.

The present invention is widely applicable as a sensing amplifier in a semiconductor memory such as an RAM, an ROM or the like using FETs.

I claim:

1. A sensing amplifier for sensing an output signal from a capacitive MISFET memory cell containing a memory capacitance, comprising:
  an input terminal for receiving the output signal from said memory cell;
  an output terminal;
  first and second sensing MISFETs, the sources of said first and second sensing MISFETs being connected to a first reference potential, the drain of said first sensing MISFET being connected to the gate of said second sensing MISFET and to said output terminal, the drain of said second sensing MISFET being connected to said input terminal; and a signal level shifting circuit connected to said input terminal at an input side thereof and to the gate of said first sensing MISFET at an output side thereof for shifting the level of the output signal from said memory cell, the level-shifted output signal being applied to the gate of said first sensing MISFET.

2. A sensing amplifier as set forth in claim 1, further comprising a preconditioning circuit including capacitive means having its one end connected to said first reference potential and the other end connected to said input terminal, precharge means connected between a second reference potential and said input terminal for precharging said capacitive means in response to a first clock signal prior to the application of the output signal from said memory cell to said sensing amplifier to preset said sensing amplifier, and means connected between said second reference potential and the drain of said first sensing MISFET for coupling said second reference potential to the drain of said first sensing MISFET in response to a second clock signal after the presetting of said sensing amplifier.

3. A sensing amplifier as set forth in claim 2, wherein said signal level shifting circuit comprises a series circuit connected between said first and second reference potentials, said series circuit including a drive MISFET whose gate is connected to said input terminal and load means having a first load MISFET whose gate is connected to the drain of said first sensing MISFET, a junction point of said series circuit being connected to the gate of said first sensing MISFET.

4. A sensing amplifier as set forth in claim 3, wherein said load means further includes a second load MISFET whose source and drain are connected to the source of and the drain of said first load MISFET respectively and whose gate is coupled to said second clock signal, the level of said load level-shifted output signal from said signal level shifting circuit being determined by the ratio of said drive MISFET to said second load MISFET.

5. A sensing amplifier as set forth in claim 3, wherein said load means further includes a resistor connected between the source and drain of said first load MISFET.

6. A sensing amplifier as set forth in claim 2, wherein said signal level shifting circuit includes a series circuit which has a first capacitor connected to said input terminal and a second capacitor connected to said first reference potential and second precharge means connected between said second reference potential and a junction point of said first and second capacitors for precharging said second capacitor in response to said first clock signal, said junction point of said first and second capacitors being connected to the gate of said first sensing MISFET.

7. A sensing amplifier sensing an output signal from a capacitive MISFET memory cell containing a memory capacitance, comprising:

an input terminal for receiving the output signal from said memory cell;
an output terminal;
first and second sensing MISFETs, the sources of said frist and second sensing MISFETs being connected to a first reference potential, the drain of said first sensing MISFET being connected to the gate of said second sensing MISFET and to said output terminal, the drain of said second sensing MISFET being connected to said input terminal;

capacitive means having its one end connected to said first reference potential and the other end connected to said input terminal;

precharge means, connected between a second reference potential and said input terminal, for precharging said capacitive means in response to a first clock signal prior to the application of the output signal from said memory cell to said sensing amplifier to preset said sensing amplifier;

means, connected between said second reference potential and the drain of said first sensing MISFET, for coupling said second reference potential to the drain of said first sensing MISFET in response to a second clock signal after the presetting of said sensing amplifier; and a signal level shifting circuit for shifting the level of out output signal from said memory to apply the level-shifted output signal to the gate of said first sensing MISFET, said signal level shifting circuit including a drive MISFET whose gate is connected to said input terminal and a first load MISFET whose gate is connected to the drain of said first sensing MISFET, the drain of said drive MISFET being connected to said second reference potential, the source of said drive MISFET and the drain of said first load MISFET being connected to each other and to the gate of said first sensing MISFET, the gate of said first load MISFET being connected to the drain of said first sensing MISFET and the gate of said second sensing MISFET, the source of said first load MISFET being connected to said first reference potential.

8. A sensing amplifier as set forth in claim 7, wherein said signal level shifting circuit further includes a second load MISFET whose source and drain are connected to the source and drain of said first load MISFET respectively and whose gate is coupled to a second clock signal.

9. A sensing amplifier as set forth in claim 7, wherein said signal level shifting circuit further includes a resistor connected between the source and drain of said first load MISFET.

10. A sensing amplifier for sensing an output signal from a capacitive MISFET memory cell containing a memory capacitance, comprising:

an input terminal for receiving the output signal from said memory cell;
an output terminal;
a latch circut including a first and second MISFETs whose junction point is connected to said input terminal and a second inverter having third and fourth MISFETs whose junction point is connected to said output terminal, first and second clock signals being applied to the gates of said first and third MISFETs respectively, the gate of said second MISFET being connected to said output terminal; and a signal level shifting circuit connected to said input terminal at an input side thereof and to the gate of said fourth MISFET at an output side thereof for shifting the level of the output signal of said memory cell to apply the level-shifted output signal to the gate of said fourth MISFET.

11. A sensing amplifier as set forth in claim 10, wherein said signal level shifting circuit includes a drive MISFET whose gate is connected to said input terminal and load means having a first load MISFET whose gate is connected to the gate of said second MISFET of said latch circuit and to said output terminal, a junction point of said drive MISFET and said first load MISFET being connected to the gate of said fourth MISFET of said latch circuit.

12. A sensing amplifier as set forth in claim 11, wherein said load means further has a second load MISFET whose source and drain are connected to the source and drain of said first load MISFET respectively and whose gate is coupled to said second clock signal.

13. A sensing amplifier as set forth in claim 11, wherein said load means further has a resistor connected between the source and drain of said first load MISFET.

14. A sensing amplifier as set forth in claim 10, wherein said signal level shifting circuit includes precharge means and a series circuit of first and second capacitors, one end of said first capacitor being connected to said input terminal, a junction point of said first and second capacitors being connected to said precharge means and to the gate of said fourth MISFET of said latch circuit, said precharge means precharging said second capacitor in response to said first clock signal.

* * * * *